United States Patent [19]
Sato

[11] Patent Number: 5,290,709
[45] Date of Patent: Mar. 1, 1994

[54] METHOD OF MANUFACTURING SEMICONDUCTOR DEVICE

[75] Inventor: Akira Sato, Yamagata, Japan

[73] Assignee: NEC Corporation, Japan

[21] Appl. No.: 865,961

[22] Filed: Apr. 9, 1992

[30] Foreign Application Priority Data

Apr. 16, 1991 [JP] Japan ................... 3-082781

[51] Int. Cl.[5] .......................................... H01L 21/426
[52] U.S. Cl. ....................... 437/20; 437/229;
437/931; 148/DIG. 76; 148/DIG. 82;
148/DIG. 83
[58] Field of Search ............... 437/20, 931, 229;
148/DIG. 76, DIG. 82, DIG. 83

[56] References Cited

U.S. PATENT DOCUMENTS 5,075,240  12/1991  Yama et al. .................. 437/931

FOREIGN PATENT DOCUMENTS 60-234318  11/1985  Japan .
62-248223  10/1987  Japan .
63-278325  11/1988  Japan .
1-196817   8/1989   Japan .
2-16737    1/1990   Japan .
2-63116    3/1990   Japan .

Primary Examiner—Olik Chaudhuri
Assistant Examiner—Ourmazd S. Ojan
Attorney, Agent, or Firm—Laff, Whitesel, Conte & Saret

[57] ABSTRACT

According to the present invention, in the ion implantation step in manufacturing a semiconductor device, a resist of a resist pattern formed on a portion of a semiconductor wafer is removed from the outer peripheral portion of the semiconductor wafer, and ion implantation is performed through the resist pattern.

Since the resist is removed from the outer peripheral portion, a contact portion between a semiconductor wafer fixing portion of an ion implantation unit and the semiconductor wafer is conductive. Therefore, charges generated by the ion implantation escape from the wafer fixing portion, and the semiconductor wafer is not charged, thereby preventing electrostatic breakdown.

2 Claims, 3 Drawing Sheets

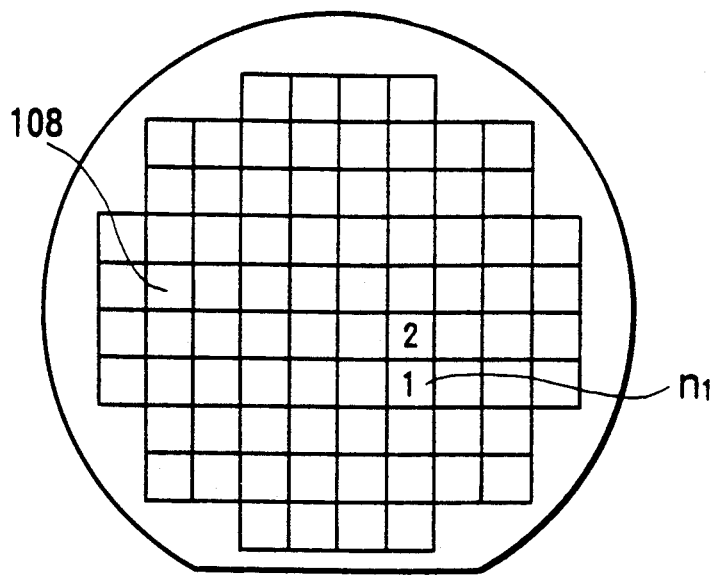
F I G. 2B

METHOD OF MANUFACTURING SEMICONDUCTOR DEVICE

BACKGROUND OF THE INVENTION

The present invention relates to a method of manufacturing a semiconductor device and, more particularly, to a method of manufacturing a semiconductor device, capable of preventing electrostatic breakdown of the semiconductor device in an ion implantation step.

According to a conventional method of manufacturing a semiconductor device, as shown in FIG. 3A, a resist 202 used as a mask for ion implantation is coated on a semiconductor wafer 201. As shown in FIG. 3B, the resist 202 is exposed and developed to form a pattern 203, and, as shown in FIG. 3C, an impurity is doped in a target portion of the semiconductor wafer by implanting ions 204.

In the conventional method of manufacturing a semiconductor device, an outer peripheral insulating resist 202a is coated on the outer peripheral portion of the semiconductor wafer even after the pattern is formed, and, therefore, the semiconductor wafer 201 and a semiconductor wafer fixing portion 205 of an ion implantation unit are insulated from each other by the resist 202a. For this reason, when the semiconductor wafer is charged in the ion implantation step, the charged cannot escape from the semiconductor wafer, and electrostatic breakdown disadvantageously occurs in the semiconductor devices on the semiconductor wafer 201.

SUMMARY OF THE INVENTION

It is an object of the present invention to provide a method of manufacturing a semiconductor device, capable of preventing electrostatic breakdown of the semiconductor device caused by charges generated in an ion implantation step.

In order to achieve the above object, according to the present invention, there is provided a method of manufacturing a semiconductor device comprising the steps of coating a resist on an entire surface of a semiconductor wafer, exposing and developing the coated resist to form a resist pattern at an inner peripheral portion of the semiconductor wafer and to remove the resist from an outer peripheral portion of the semiconductor wafer, and performing ion implantation to the semiconductor wafer through the resist pattern.

BRIEF DESCRIPTION OF THE DRAWINGS

FIG. 2B is a plan view of a semiconductor wafer showing an electrostatic breakdown count of a semiconductor wafer manufactured according to the embodiment of the present invention.

DESCRIPTION OF THE PREFERRED EMBODIMENT

Figure 1A:
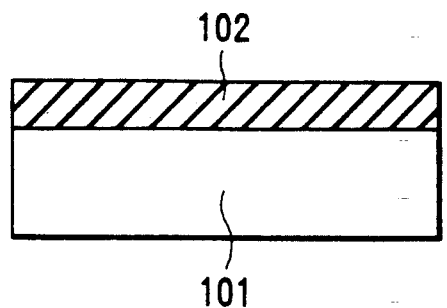
FIGS. 1A to 1C are sectional views of a semiconductor wafer in the steps in manufacturing a semiconductor device for explaining an embodiment of the present invention.
Figure 1B:
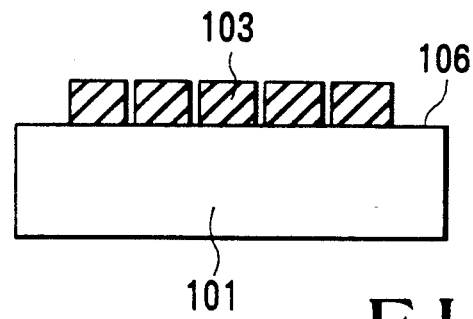
Figure 1C:
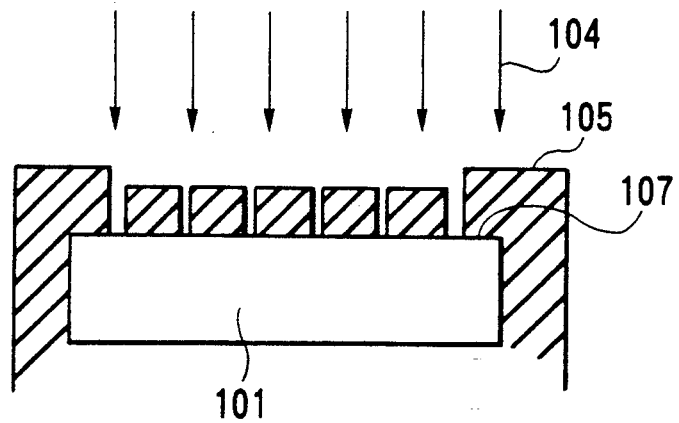

A method of manufacturing a semiconductor device according to the present invention will be described below. FIGS. 1A to 1C are sectional views of a semiconductor wafer in the steps in manufacturing a semiconductor device for explaining an embodiment of the present invention.

As shown in FIG. 1A, a resist 102 is coated on the entire surface of a semiconductor wafer 101. As shown in FIG. 1B, the coated resist 102 is exposed and developed to form a pattern 103 at the inner peripheral portion of the semiconductor wafer 101. At the same time, the resist at the outer peripheral portion of the semiconductor wafer 101 is removed.

Charged ions 104 are doped in the resultant structure in the ion implantation step shown in FIG. 1C to charge the resist 102 serving as an insulator. However, since a contact portion 107 between a semiconductor wafer fixing portion 105 of an ion implantation unit and the semiconductor wafer 101 is conductive, the charges escape from the conductive semiconductor wafer fixing portion 105, thereby preventing electrostatic breakdown.

Figure 2A:
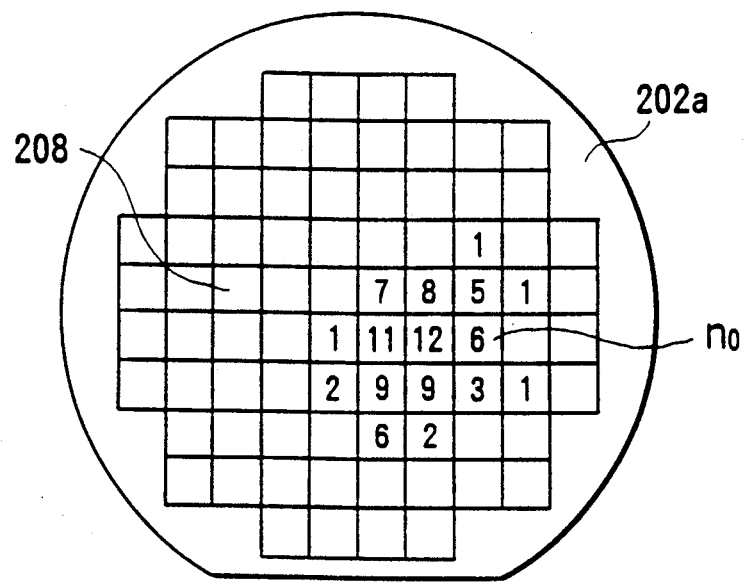
FIG. 2A is a plan view of a semiconductor wafer showing an electrostatic breakdown count of a semiconductor wafer manufactured by a conventional method.
Figure 3A:
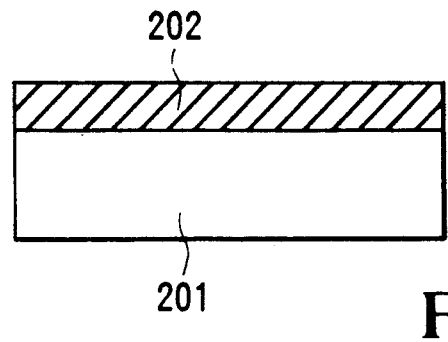
FIGS. 3A to 3C are sectional views of a semiconductor wafer in the steps in manufacturing a semiconductor device for explaining a prior art.
Figure 3B:
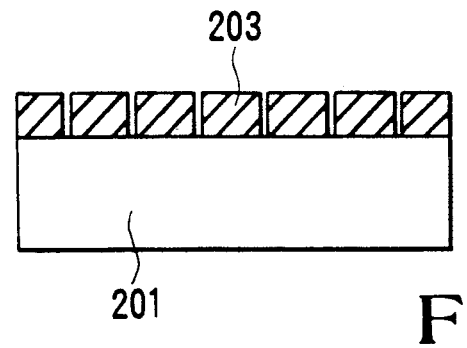
Figure 3C:
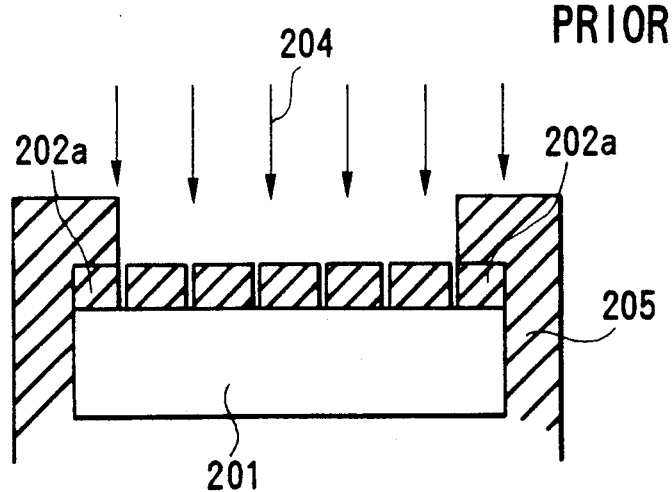

The effect of the present invention to the electrostatic breakdown of a semiconductor device is shown in FIGS. 2A and 2B. In FIG. 2A, a number $n_0$ in each semiconductor chip represents an electrostatic breakdown count in each of semiconductor chips 208 after ion implantation when a resist 202a is coated on the peripheral portion of a semiconductor wafer except for a portion in which a pattern is formed in a prior art. In FIG. 2B, a number $n_1$ represents an electrostatic breakdown count in each of semiconductor chips 108 after ion implantation when a resist is removed from the outer peripheral portion of the semiconductor wafer according to the present invention. As is apparent from FIGS. 2A and 2B, the electrostatic breakdown count and the electrostatic breakdown area after the ion implantation in the semiconductor wafer having no peripheral resist as shown in FIG. 2B are smaller than those in the semiconductor wafer having the peripheral resist.

As described above, according to the present invention, since the contact portion between the semiconductor wafer fixing portion of the ion implantation unit and the semiconductor wafer is conductive by removing the resist from the outer peripheral portion of the semiconductor wafer, charges generated by the ion implantation escape from the semiconductor fixing portion, and the semiconductor wafer is not charged, thereby preventing electrostatic breakdown.

I claim:

1. A method of manufacturing a semiconductor device comprising the steps of:

coating an entire surface of a semiconductor wafer with an insulating resist;

exposing and developing said coated insulating resist to form a resist pattern at an inner peripheral portion of said semiconductor wafer and to remove said insulating resist from an outer peripheral portion of said semiconductor wafer;

the outer peripheral portion of said semiconductor wafer from which said insulating resist is removed being placed in surface contact with a fixing portion of an ion implantation unit, so that charges accumulated in said semiconductor wafer during an ion implantation step escape through said fixing portion; and performing ion implantation to said semiconductor wafer through said insulating resist pattern.

2. A method according to claim 1, wherein formation of said resist pattern is performed simultaneously with removal of said resist from the outer peripheral portion of said semiconductor wafer.

* * * * *